United States Patent [19]

Parker

[11] Patent Number: 5,121,005
[45] Date of Patent: Jun. 9, 1992

[54] PROGRAMMABLE LOGIC ARRAY WITH DELAYED ACTIVE PULL-UPS ON THE COLUMN CONDUCTORS

[75] Inventor: Lanny L. Parker, Mesa, Ariz.

[73] Assignee: Motorola, Inc., Schaumburg, Ill.

[21] Appl. No.: 677,908

[22] Filed: Apr. 1, 1991

[51] Int. Cl.⁵ .......................................... H03K 19/177
[52] U.S. Cl. .................................. 307/465; 307/443; 307/481
[58] Field of Search ................ 307/443, 465, 468–469, 307/481; 340/825.83, 825.87

[56] References Cited

U.S. PATENT DOCUMENTS

| | | | |
|---|---|---|---|
| 4,577,190 | 3/1986 | Law | 307/468 X |
| 4,697,105 | 9/1987 | Moy | 307/481 X |
| 4,740,721 | 4/1988 | Chung et al. | 307/469 X |
| 4,760,290 | 7/1988 | Martinez | 307/443 X |
| 4,764,691 | 8/1988 | Jochem | 307/468 |
| 4,769,562 | 9/1988 | Ghisio | 307/465 X |
| 4,831,285 | 5/1989 | Gaiser | 307/465 |
| 4,959,646 | 9/1990 | Podkowa et al. | 307/465 X |
| 4,990,801 | 2/1991 | Caesar et al. | 307/469 |

Primary Examiner—David Hudspeth
Attorney, Agent, or Firm—Robert D. Atkins

[57] ABSTRACT

A programmable logic array operates with a single clock signal frequency which delays a control signal allowing time for the input signals to reach steady state on the column conductors of the AND-plane before enabling an active pull-up circuit to latch those column conductors left floating by the input signals. The control signal for the active pull-up circuit of the OR-plane is also delayed allowing time for the signals on the column conductors and row conductors of the OR-plane to reach steady state and provide glitch-free output signals. The propagation paths for the control signals are made slower than the worst case data path through the AND-plane and OR-plane to eliminate race conditions.

20 Claims, 2 Drawing Sheets

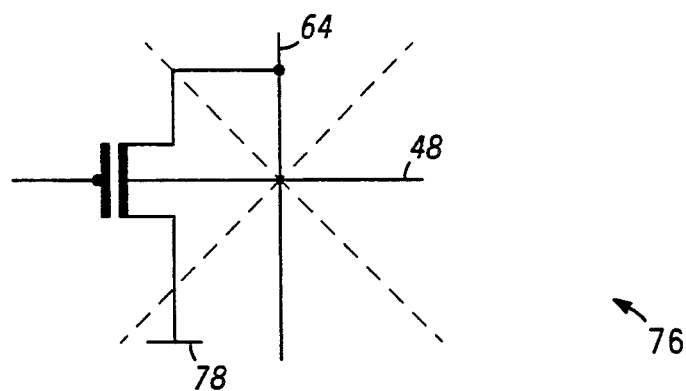
FIG. 2
FIG. 3A
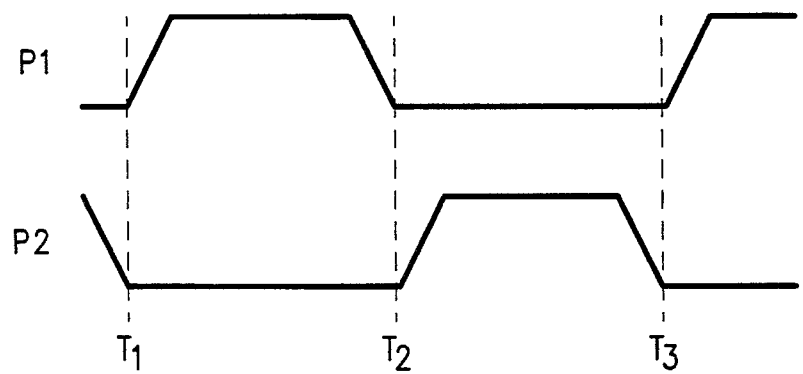
FIG. 3B
FIG. 4
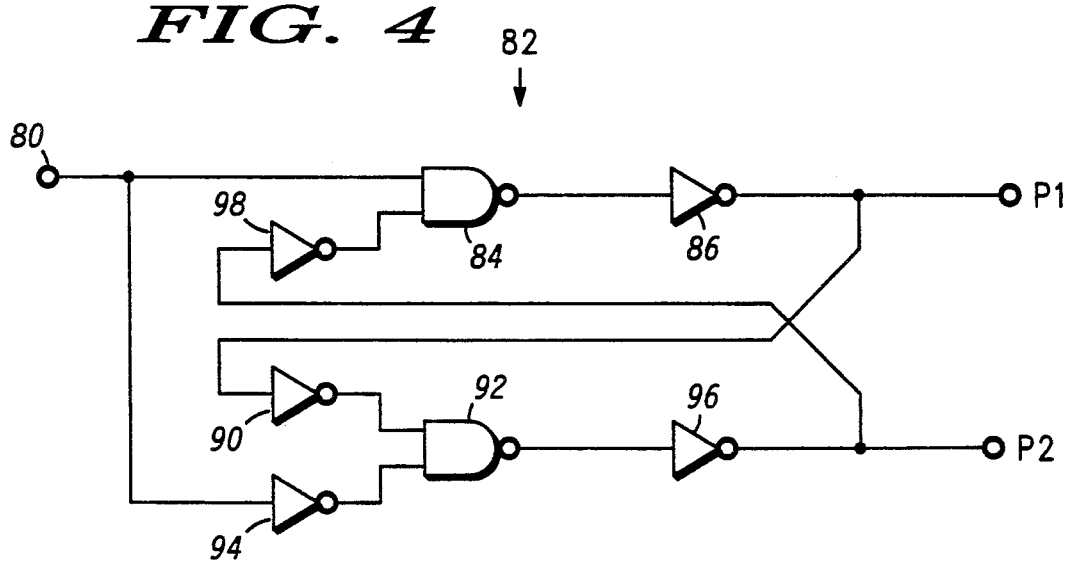

PROGRAMMABLE LOGIC ARRAY WITH DELAYED ACTIVE PULL-UPS ON THE COLUMN CONDUCTORS

FIELD OF THE INVENTION

This invention relates in general to programmable logic arrays (PLA) and, more particularly, to a PLA circuit having delayed pull-up devices operating with non-overlapping phases of an input clock signal.

BACKGROUND OF THE INVENTION

Programmable logic arrays are commonly used in digital design to achieve a specific logical operation by interconnecting a generic conductor structure in a predetermined manner. One conventional PLA structure comprises first and second planes of conductors commonly referred to as the AND-plane and the OR-plane. The AND-plane includes first row conductors coupled for receiving the input signals and column conductors connected to the first row conductors at predetermined intersections. The OR-plane uses the same column conductors interconnected with second row conductors for providing the output signals of the PLA with the specified logic function. The column conductors are typically positioned perpendicular to the first and second row conductors with a transistor disposed at each intersection thereof such that the gate and drain terminals of those transistors needed to achieve the desired logical operation of the PLA are coupled to appropriate row and column conductors.

The column conductors and second row conductors each have an active pull-up circuit responsive to first and second clock signals operating at different frequencies to pre-charge the conductors at the start of each PLA processing cycle. The first and second clock signals are ideally in-phase, with the first clock signal operating at say four megahertz while the second clock signal operates at two megahertz. The first and second clock signals establish multiple time slots for processing the input signal through the PLA while avoiding any DC conduction paths between the positive power supply conductor through the active pull-up transistors to ground potential. Such DC conduction paths can cause unacceptable static power drain through the PLA.

During a first time slot of the PLA processing cycle when both the first and second clock signals are high, the active pull-up devices pre-charge the column conductors of the AND-plane and second row conductors of OR-plane to a logic one. Each of the transistors interconnecting the AND-plane and OR-plane have their sources coupled to a virtual ground which is disabled during the first time slot preventing the input signals from pulling the column conductors of the AND-plane to logic zero at the same time the active pull-up transistors are conducting thereby avoiding the DC conduction paths. During a second time slot when the first clock signal is low and the second clock signal is still high, the active pull-up transistors are disabled and the virtual ground is re-enabled allowing the logic levels of the input signals to pull the associated column conductors to logic zero while the remaining conductors (not pulled low) maintain the pre-charged logic high. During a third time slot when the second clock signal becomes low, the logic levels on the column conductors of the AND-plane are transferred to the second row conductors of the OR-plane and out the PLA.

The virtual ground for the interconnecting transistors between the AND-plane and the OR-plane is typically provided at the interconnecting node between two N-channel MOS transistors serially coupled between the positive power supply conductor and ground potential. The virtual ground is enabled when the lower transistor is conducting and disabled when the upper N-channel device is conducting pulling the interconnecting node of the transistors to logic high. Unfortunately, the virtual ground concept has several drawbacks. The N-channel transistors providing the virtual ground are typically disposed on diffusion layers which are often widened to keep the resistance low and ensure adequate ground. However, widening the diffusion layer also increases the capacitance which slows downs the propagation of the input signals. Moreover, the active pull-up transistors must also charge the larger diffusion capacitance which contributes to the slower operation of the PLA and causes higher switching currents.

Another significant problem with the conventional PLA circuit is the use of first and second clock signals operating at different frequencies to generate the time slots for precharging the conductors and processing the input signals through the PLA. Great care must be taken to ensure the edges of the first and second clock signals are aligned to avoid generating unwanted pulses which may, for example, enable the active pull-up transistors during the second time slot when the input signal is processing through the PLA and thereby create glitches in the output signals. The first and second clock signals are highly susceptible to timing skew between their transitions since they are often generated external to the PLA and may travel considerable distance through one or more integrated circuits of the system before reaching the PLA. It is necessary to carefully analyze the phasing of the first and second clock signals and compensate for any timing skew therebetween at the input of the PLA.

Hence, what is needed is an improved PLA circuit operating without the special multiple clocking schemes in order to avoid the timing skew problem. Furthermore, it is desirable to eliminate the virtual grounds for the interconnecting transistors between the row and column conductors.

SUMMARY OF THE INVENTION

Briefly stated, the invention comprises a plurality of column conductors coupled to a plurality of first row conductors at predetermined intersections thereof such that a first logic state of ones of the plurality of input signals establishes a first logic state on first ones of the plurality of column conductors while a second logic state of ones of the plurality of input signals allows second ones of the plurality of column conductors to float. A first circuit has a plurality of outputs respectively coupled to the plurality of column conductors and is responsive to an input clock signal for establishing a second logic state on the second ones of the plurality of column conductors after the first logic state is established on the first ones of the plurality of column conductors.

In another aspect, the present invention is a method of processing a plurality of input signals through a programmable logic array in response to first and second phases of an input clock signal comprising the steps of applying the plurality of input signals to a plurality of first row conductors during the first phase of the input clock signal such that a first logic state of ones of the plurality of input signals establishes a first logic state on first ones of a plurality of column conductors interconnected in a predetermined manner to the plurality of first row conductors while a second logic state of ones of the plurality of input signals allows second ones of the plurality of column conductors to float, and establishing a second logic state on the second ones of the plurality of column conductors during the second phase of the input clock signal after the first logic state is established on the first ones of the plurality of column conductors.

Thus, one advantage of the present invention is the technique of delaying a control signal in response to an input clock signal to allow time for the input signals to reach steady state on the column conductors of the AND-plane before enabling an active pull-up circuit to latch those column conductors left floating by the input signals. The control signal for the active pull-up circuit of the OR-plane is also delayed allowing time for the signals on the column conductors and row conductors of the OR-plane to reach steady state and provide glitch-free output signals. The propagation paths for the control signals are made slower than the worst case data through the AND-plane and OR-plane to eliminate race conditions.

BRIEF DESCRIPTION OF THE DRAWING

FIG. 2 is a schematic diagram illustrating a transistor interconnecting the row and column conductors of the PLA of FIG. 1;

FIGS. 3A and 3B are waveform plots illustrating the non-overlapping phases of an input clock signal; and FIG. 4 is a schematic diagram illustrating a non-overlapping clock generator circuit used in the preferred embodiment.

DETAILED DESCRIPTION OF THE PREFERRED EMBODIMENT

Figure 1:
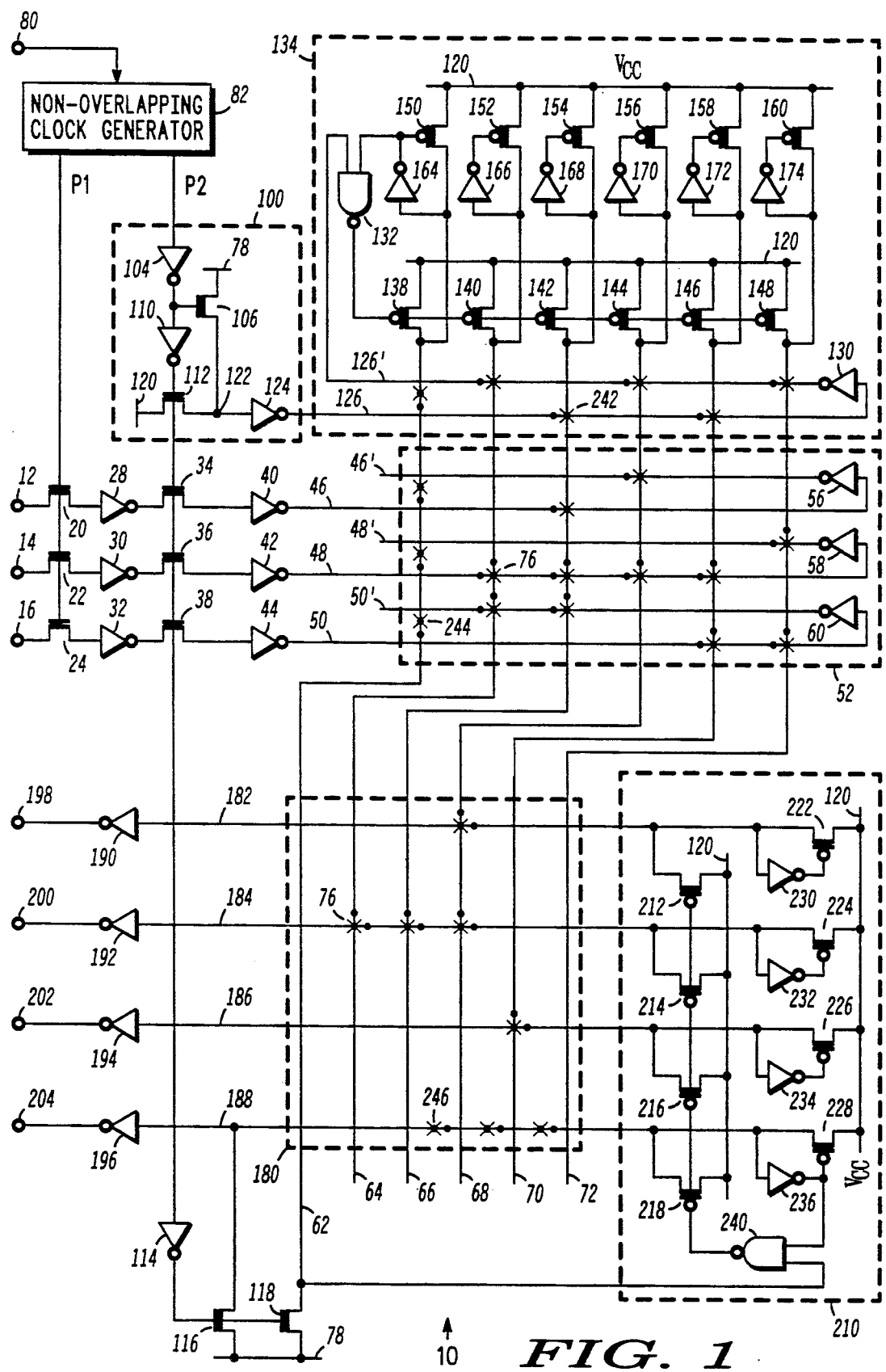
FIG. 1 is a schematic and block diagram illustrating a PLA.

A programmable logic array (PLA) 10 of the present invention is shown in FIG. 1 suitable for manufacturing in integrated circuit form using conventional integrated circuit processes. ONE usage for PLA 10 is as combination logic in a telecommunication network manager system. A plurality of digital input signals are applied at inputs 12, 14 and 16 at the drains of transistors 20, 22 and 24. The sources of transistors 20, 22 and 24 are respectively coupled through inverters 28, 30 and 32 to the drains of transistors 34, 36 and 38. The sources of transistors 34, 36 and 38 are coupled to the inputs of inverters 40, 42 and 44, the outputs of which are coupled to row conductors 46, 48 and 50, respectively, forming a portion of AND-plane 52. The signals on row conductors 46, 48 and 50 are complemented by inverters 56, 58 and 60, respectively, and applied to row conductors 46′, 48′ and 50′. AND-plane 52 also includes column conductors 62, 64, 66, 68, 70 and 72.

Transistors like 76 are placed at the intersection of each of conductors 46-14 50 and 46′-50′ and conductors 62-72 although only those needed to provide the desired logical operation are connected thereto. For example, an "X" mark at the intersection of conductors 48 and 64 with a dot on conductor 48 and a similar dot on conductor 64 is a conventional representative of transistor 76. Further detail of transistors like 76 is shown in FIG. 2 wherein the gate of transistor 76 is coupled to conductor 48 and its drain is coupled to conductor 64, while the source of transistor 76 is coupled to power supply conductor 78 operating at ground potential. Transistor 76 does not use a virtual ground.

Unlike most conventional PLAs which pre-charge the column conductors before processing the input signals, the present invention establishes the logic levels on conductors 46-50 and 46′-50′ before charging conductors 62-72. The prior art requires two clock signals operating at different frequencies to generate the multiple time slots for pre-charging of the column conductors and processing the input signal while avoiding the DC conduction paths through the PLA, whereas in the present invention, non-overlapping phases of a single clock signal control the active pull-up circuits. The input clock signal operating at say four megahertz is applied at input 80 of non-overlapping clock generator circuit 82 which generates therefrom a first clock signal phase $P_1$ operating at frequency and inphase with the clock signal applied at input 80 as shown in FIG. 3A. Non-overlapping clock generator circuit 82 also develops complementary phase clock signal phase $P_2$ as shown in FIG. 3B. An important feature of clock signals $P_1$ and $P_2$ is the non-overlapping quality wherein no more than one signal is high at any point in time. The non-overlapping phases of the single clock signal negate the timing skew problem of multiple clock signals which could produce glitches in the prior art PLA.

The clock signals $P_1$ and $P_2$ may be generated from the clock generator circuit shown in FIG. 4 including NAND gate 84 having a first input coupled to input 80 and an output coupled through inverter 86 for providing the clock signal $P_1$. The output of inverter 86 is also coupled through inverter 90 to the first input of NAND gate 92 while the second input of the same receives the input clock signal complemented by inverter 94. The output signal of NAND gate 92 drives inverter 96 for providing the clock signal $P_2$ which is also applied through inverter 98 to the second input of NAND gate 84. When the input clock signal applied at input 80 is logic one, the clock signal $P_1$ is also logic one which produces logic zeros at the first and second inputs of NAND gate 92. The output of NAND gate 92 is logic one and the clock signal $P_2$ is logic zero. The first and second inputs of NAND gate 84 are thus logic one and its output is logic zero leaving clock signal $P_1$ at logic one as per the initial condition. As the input clock signal at input 80 falls to a logic zero, the output of NAND gate 84 becomes logic one forcing the clock signal $P_1$ to transition to logic zero. The logic zero at input 80 produces a logic one at the second input of NAND gate 92. However, the output of NAND gate 92 cannot change to logic zero until the clock signal $P_1$ switches to logic zero. Hence, the clock signal $P_2$ remains logic zero until clock signal $P_1$ becomes logic zero since the latter provides the second logic one at the first input of NAND gate 92 necessary to switch clock signal $P_2$ to logic one. The non-overlapping period is determined by the delay through inverters 90 and 98 and may be adjusted by sizing the transistors thereof. A similar logic operation is provided on the opposite edge wherein clock signal $P_1$ cannot transition to logic one until clock signal $P_2$ has changed to logic zero. Thus, clock signals $P_1$ and $P_2$ are complementary and non-overlapping such that logic ones never appear simultaneously.

Continuing with FIG. 1, clock signal $P_1$ is applied at the gates of transistors 20, 22 and 24, and clock signal $P_2$ is applied to timing latch 100 which includes inverter 104 coupled for receiving the clock signal $P_2$ and transistor 106 having a gate coupled to the output of inverter 104 and a source coupled to power supply conductor 78. The output of inverter 104 is also coupled through inverter 110 to the gates of transistors 112, 34, 36 and 38 and continues through inverter 114 to the gates of transistors 116 and 118. The drain of transistor 118 is coupled to conductor 62, and the sources of transistors 116 and 118 are coupled to power supply conductor 78. Returning to timing latch 100, the drain of transistor 112 is coupled to power supply conductor 120 operating at a positive potential such as VCC and its source is coupled to the drain of transistor 106 at node 122 and through inverter 124 to conductor 126. Conductor 126 continues through inverter 130 to conductor 126' at the first input of NAND gate 132 of active pull-up circuit 134.

Transistors 138, 140, 142, 144, 146 and 148 in combination with transistors 150, 152, 154, 156, 158 and 160 provide the active pull-up function for circuit 134. The sources of transistors 138-148 are coupled to power supply conductor 120 while the drains are respectively coupled to conductors 62-72. The output of NAND gate 132 is coupled to the gates of transistors 138-148. Conductors 62-72 are also coupled to the drains of transistors 150-160 and to the inputs of inverters 164, 166, 168, 170, 172 and 174. The outputs of inverters 164-174 are coupled to the gates of transistors 150-160, respectively, and the sources of transistors 150-160 are coupled to power supply conductor 120. The output of inverter 164 is also coupled to the second input of NAND gate 132.

PLA 10 further includes OR-plane 180 including conductors 62-72 and conductors 182, 184, 186 and 188 coupled through inverters 190, 192, 194 and 196, respectively, to output terminals 198, 200, 202 and 204 of PLA 10. Conductor 188 is also coupled to the drain of transistor 116. Transistors like 76 shown as an "X" mark with connecting dots are provided at the intersection of conductors 64-72 and conductors 182-186 to illustrate the connection between AND-plane 52 and OR-plane 180 necessary to complete the desired logical operation of PLA 10. The output signals of PLA 10 may also be tapped at conductors 64-72 if the logic of OR-plane 180 is not needed. One such application is a basic decoder design.

Conductors 182-188 of OR-plane 180 are coupled to active pull-ups circuit 210 at the drains of transistors 212, 214, 216 and 218, respectively. The sources of transistors 212-218 are coupled to power supply conductor 120. Conductors 182-188 are also coupled to the drains of transistors 222, 224, 226 and 228 and to the inputs of inverters 230, 232, 234 and 236. The outputs of inverters 230-236 are coupled to the gates of transistors 222-228, respectively. The output of inverter 236 is also coupled to the first input of NAND gate 240 while its second input is coupled to conductor 62 and its output is coupled to the gates of transistors 212-218.

For the operation of PLA 10, consider one complete processing cycle beginning at time $t_1$ of FIGS. 3A-3B. The time period between times $t_1$ and $t_2$ is provided to allow the input signals applied at inputs 12-16 time to settle to a steady state value and become valid. The logic one of clock signal $P_1$ between times $t_1$ and $t_2$ enables transistors 20-24 thereby charging the outputs of inverters 28-32 to the complement of the input signals. The low state of the clock signal $P_2$ turns on transsinstor 106 pulling node 122 and the output of inverter 110 to logic zero. Transistors 34-38 are off blocking the input signals from conductors 46-50, while transistors 116 and 118 are enabled pulling conductor 62 and conductor 188 to logic zero since no connection is made between conductor 62 and conductors 46-50 and 46'-50', or conductor 188 and conductors 62-72. At time $t_2$, clock signal $P_1$ goes low turning off transistors 20-24 and locking the complement of the input signals at the outputs of inverters 28-32. Shortly after time $t_2$, clock signal $P_2$ begins to rise to logic one turning off transistors 106, 116 and and enabling transistors 34-38 and 112. The input signals pass through transistors 34-38 to conductors 46-50 and 46'-50'and enable or disable transistors like 76 according to the logic states thereof. For example, if the input signal applied at input 14 is logic one, then conductor 48 is pulled to logic one by inverter 42. This enables transistor 76 and pulls conductor to logic zero, see FIG. 2. Node 122 is pulled to logic one through transistor 112 producing a logic zero on conductor 126 and a logic one on conductor 126' at the first input of NAND gate 132. Transistors like 242 are coupled to conductors 1266' for providing a gate capacitance thereto such that the propagation delay of the control signal passing from the output of inverter 124 through conductors 126 and 126' is the slowest path compared to conductors 46-50 and 46'-50'. Since conductors -48' of FIG. 1 are the heaviest loaded with five transistors connecting to conductors 64-72, conductors 126-126' are also loaded with the gate capacitances of five transistors. The drains and sources of transistors like 242 are not connected to conductors 64-72 to avoid interfering with the logical operation of PLA 10. Thus, the input signals from inputs 12-16 are present on the gates of transistors like 76 of AND-plane 52, and the logic states for those conductors 64-72 connected to conductors 46-50 and 46'-50' are set even with, or before, the logic one from node 122 arrives at the first input of NAND gate 132.

The logic zero on conductor 62 from transistor 118˙is inverted to logic one by inverter 164 and applied to the second input of NAND gate 132. The logic one at the first input of NAND gate 132 from conductor 126', in combination with the logic one at the second input of the same, produces a logic zero at the gates of transistors 138-148 to pull high those conductors 4-72 which have no connection to conductors 46-50 and 46'-50', or are left floating by the logic state of the input signal. That is, conductors 64-72 not already pulled low by transistors like 76 in response to the input signals are brought to logic one by active pull-up circuit 134. Conductor 62 is always pulled to logic one by transistor 138 since no connections are made to conductors 46-50 and 46'-50'. Thus, the slowest conduction ˙path through conductors 126 and 126' has provided sufficient time to establish the proper logic state on conductors 46-50 and 46'-50' and conductors 64-72 such that active pull-up transistors 138-148 pull high only those conductors 64-72 that are left floating. Conductors 64-72 reaching a logic one state enable respective transistors 152-160 through inverters 166-174 to latch the logic ones thereon. The logic zero at the output of inverter 164 from the logic one on conductor 62 produces a logic one at the output of NAND gate 132 turning off pull-up transistors 138-148. Latching transistors 150-160 maintain the logic one on those conductors 64-72 not specifically pulled low by the input signals. Thus, the proper logic states are established on conductors 64-72 in accordance with the input signals.

Conductor 62 serves as timing delay to provide the slowest path for the signals propagating through conductors 64-72 such that the logic states on conductors 64-72 reach OR-plane 180 and enable connecting transistors like 76 between conductors 64-72 and conductors 182-186 before the control signal on conductor 62 enables active pull-up circuit 210. Transistors like 244 have their gates coupled to conductor 62 for providing a capacitive load thereto sufficient to ensure the slowest path. For example, conductors 66-68 of FIG. 1 are the heaviest loaded with four transistors each connecting to the row conductors. Therefore, conductor 62 is also loaded with the gate capacitances of four transistors like 244. The drains and sources of transistors like 244 are not connected to the row conductors to avoid interfering with the logical operation of PLA 10. Thus, the signals from AND-plane 52 flowing through conductors 64-72 are present on the gates of transistors like 76 of OR-plane 180, and the logic states for those conductors 182-186 connected to conductors 64-72 are set even with, or before, the logic one from conductor 62 arrives at the second input of NAND gate 240. Conductor 188 previously established at logic zero between times $t_1$ and $t_2$ by transistor 116 produces a logic one at the first input of NAND gate 240. The logic one propagating through the slowest conduction path of conductor 62 reaches the second input of NAND gate 240 producing a logic zero at the output thereof enabling pull-up transistors 212-218. Conductors 182-186 which are floating from the lack of drive signal from conductors 64-72 are thus pulled high through pull-up transistors 212-218. Those conductors 182-188 at logic one are latched high by latching transistors 222-228 through inverters 230-236. The output logic signals are available at output terminals 198-202 devoid of glitches induced by timing skew of the input clock signal. Conductor 188 is loaded with the gate capacitance of transistors like 246 equal to the maximum number of load transistors on conductors 182-186.

Hence, what has been provided is a novel programmable logic array operating with a single clock signal frequency which delays a control signal allowing time for the input signals to reach steady state on the column conductors of the AND-plane before enabling an active pull-up circuit to latch those column conductors left floating by the input signals. The control signal for the active pull-up circuit of the OR-plane is also delayed allowing time for the signals on the column conductors and row conductors of the OR-plane to reach steady state and provide glitch-free output signals.

I claim:

1. A programmable logic array, comprising:
a plurality of first row conductors coupled for receiving a plurality of input signals;
a plurality of column conductors coupled to said plurality of first row conductors at predetermined intersections thereof such that a first logic state of ones of said plurality of input signals establishes a first logic state on first ones of said plurality of column conductors while a second logic state of ones of said plurality of input signals allows second ones of said plurality of column conductors to float;
first means having a plurality of outputs respectively coupled to said plurality of column conductors and responsive to an input clock signal for establishing a second logic state on said second ones of said plurality of column conductors after said first logic state is established on said first ones of said plurality of column conductors; and
second means responsive to first and second phases of said input clock signal and having a plurality of inputs coupled for receiving a plurality of input signals and a plurality of outputs coupled to said plurality of first row conductors respectively, said first phase of said input clock signal passing said plurality of input signals through to said plurality of first row conductors such that a first logic state of ones of said plurality of input signals establishes a first logic state on first ones of said plurality of column conductors while a second logic state of ones of said plurality of input signals allows second ones of said plurality of column conductors to float.

2. The programmable logic array of claim 1 further comprising:
a plurality of second row conductors coupled to said plurality of column conductors at predetermined intersections thereof such that said second logic state on said second ones of said plurality of column conductors establishes a first logic state on first ones of said plurality of second row conductors while said first logic state of first ones of said plurality of column conductors allows second ones of said plurality of second row conductors to float; and
third means having a plurality of outputs respectively coupled to said plurality of second row conductors and responsive to said second phase of said input clock signal for establishing a second logic state on said second ones of said plurality of second row conductors after said first logic state is established on said first ones of said plurality of second row conductors.

3. The programmable logic array of claim 2 further comprising:
a clock generator circuit having an input for receiving said input clock signal and having first and second outputs for providing said first and second phases of said input clock signal non-overlapping in time; and
a timing latch having an input coupled for receiving said second phase of said input clock signal and having first and second outputs for providing opposite states of said second phase of said input clock signal.

4. The programmable logic array of claim 3 wherein said second means includes:
a first transistor having a gate, a drain and a source, said drain being coupled for receiving one of said plurality of input signals, said gate being coupled to said first output of said clock generator circuit for receiving said first phase of said input clock signal;
a first inverter having an input coupled to said source of said first transistor and having an output;
a second transistor having a gate, a drain and a source, said drain being coupled to said output of said first inverter, said gate being coupled to said first output of said timing latch; and
a second inverter having an input coupled to said source of said second transistor and having an output coupled to one of said plurality of first row conductors.

5. The programmable logic array of claim 4 wherein said first means includes:

a third transistor having a gate, a drain and a source, said source being coupled to a first source of operating potential, said drain being coupled to one of said plurality of column conductors;

a fourth transistor having a gate, a drain and a source, said source being coupled to said first source of operating potential, said drain being coupled to said one of said plurality of column conductors;

a third inverter having an input coupled to said one of said plurality of column conductors and having an output coupled to said gate of said fourth transistor; and a first NAND gate having first and second inputs and an output, said first input being coupled to said second output of said timing latch, said second input being coupled to said output of said third inverter, said output being coupled to said gate of said third transistor.

6. The programmable logic array of claim 5 further including:

a fourth inverter having an input coupled to said first output of said timing latch and having an output;

a fifth transistor having a gate, a drain and a source, said source being coupled to a second source of operating potential, said drain being coupled to one of said plurality of second row conductors, said gate being coupled to said output of said fourth inverter; and a sixth transistor having a gate, a drain and a source, said source being coupled to said second source of operating potential, said drain being coupled to said one of said plurality of column conductors, said gate being coupled to said output of said fourth inverter.

7. The programmable logic array of claim 6 wherein said third means includes:

a seventh transistor having a gate, a drain and a source, said source being coupled to said first source of operating potential, said drain being coupled to said one of said plurality of second row conductors;

an eighth transistor having a gate, a drain and a source, said source being coupled to said first source of operating potential, said drain being coupled to said one of said plurality of second row conductors;

a fifth inverter having an input coupled to said one of said plurality of second row conductors and having an output coupled to said gate of said eighth transistor; and a second NAND gate having first and second inputs and an output, said first input being coupled to said one of said plurality of column conductors, said second input being coupled to said output of said fifth inverter, said output being coupled to said gate of said seventh transistor.

8. The programmable logic array of claim 7 wherein said timing latch includes:

a sixth inverter having an input coupled to said second output of said clock generator circuit and having an output;

a ninth transistor having a gate, a drain and a source, said source being coupled to said second source of operating potential, said gate being coupled to said output of said sixth inverter;

a seventh inverter having an input coupled to said output of said sixth inverter and having an output;

a tenth transistor having a gate, a drain and a source, said drain being coupled to said first source of operating potential, said source being coupled to said drain of said ninth transistor, said gate being coupled to said output of said seventh inverter; and an eighth inverter having an input coupled to said source of said tenth transistor and having an output coupled to said first input of said first NAND gate.

9. The programmable logic array of claim 8 wherein said clock generator circuit includes:

a third NAND gate having first and second inputs and an output, said first input being coupled for receiving said input clock signal;

a ninth inverter having an input coupled to said output of said third NAND gate and having an output coupled to said first output of said clock generator circuit;

a tenth inverter having an input coupled to said output of said ninth inverter and having an output;

an eleventh inverter having an input coupled for receiving said input clock signal and having an output;

a fourth NAND gate having first and second inputs and an output, said first input being coupled to said output of said tenth inverter, said second input being coupled to said output of said eleventh inverter;

a twelfth inverter having an input coupled to said output of said fourth NAND gate and having an output coupled to said second output of said clock generator circuit; and a thirteenth inverter having an input coupled to said output of said twelfth inverter and having an output coupled to said second input of said third NAND gate.

10. A method of processing a plurality of input signals through a programmable logic array in response to first and second phases of an input clock signal, comprising the steps of:

applying the plurality of input signals to a plurality of first row conductors during the first phase of the input clock signal such that a first logic state of ones of the plurality of input signals establishes a first logic state on first ones of a plurality of column conductors interconnected in a predetermined manner to said plurality of first row conductors while a second logic state of ones of the plurality of input signals allows second ones of said plurality of column conductors to float; and establishing a second logic state on said second ones of said plurality of column conductors during the second phase of the input clock signal after said first logic state is established on said first ones of said plurality of column conductors.

11. The method of claim 10 further including the steps of:

passing the logic state on said plurality of column conductors through to a plurality of second row conductors during the second phase of the input clock signal such that said first logic state of said first ones of the plurality of column conductors establishes a first logic state on first ones of a plurality of second row conductors interconnected in a predetermined manner to said plurality of column conductors while said second logic state of said second ones of the plurality of column conductors allows second ones of said plurality of second row conductors to float; and establishing a second logic state on said second ones of said plurality of second row conductors after said first logic state is established on said first ones of said plurality of second row conductors.

12. The method of claim 11 wherein said step of applying the plurality of input signals includes the step of delaying a first control signal which establishes said second logic state on said second ones of said plurality of column conductors until said first logic state is established on said first ones of said plurality of column conductors.

13. The method of claim 12 wherein said step of passing the logic state includes the step of delaying a second control signal which establishes said second logic state on said second ones of said plurality of second row conductors until said first logic state is established on said first ones of said plurality of second row conductors.

14. In a telecommunications network manager system a programmable logic array, comprising:
  a plurality of first row conductors;
  a plurality of column conductors coupled to said plurality of first row conductors at predetermined intersections thereof;
  first means responsive to first and second phases of an input clock signal and having a plurality of inputs coupled for receiving a plurality of input signals and a plurality of outputs coupled to said plurality of first row conductors respectively, said first phase of said input clock signal passing said plurality of input signals through to said plurality of first row conductors such that a first logic state of ones of said plurality of input signals establishes a first logic state on first ones of said plurality of column conductors while a second logic state of ones of said plurality of input signals allows second ones of said plurality of column conductors to float; and
  second means having a plurality of outputs respectively coupled to said plurality of column conductors and responsive to said second phase of said input clock signal for establishing a second logic state on said second ones of said plurality of column conductors after said first logic state is established on said first ones of said plurality of column conductors.

15. The programmable logic array of claim 14 further comprising:
  plurality of second row conductors coupled to said plurality of column conductors at predetermined intersections thereof such that said second logic state on said second ones of said plurality of column conductors establishes a first logic state on first ones of said plurality of second row conductors while said first logic state of first ones of said plurality of column conductors allows second ones of said plurality of second row conductors to float; and
  third means having a plurality of outputs respectively coupled to said plurality of second row conductors and responsive to said second phase of said input clock signal for establishing a second logic state on said second ones of said plurality of second row conductors after said first logic state is established on said first ones of said plurality of second row conductors.

16. The programmable logic array of claim 15 further comprising:
  a clock generator circuit having an input for receiving said input clock signal and having first and second outputs for providing said first and second phases of said input clock signal non-overlapping in time; and
  a timing latch having an input coupled for receiving said second phase of said input clock signal and having first and second outputs for providing opposite states of said second phase of said input clock signal.

17. The programmable logic array of claim 16 wherein said first means includes:
  a first transistor having a gate, a drain and a source, said drain being coupled for receiving one of said plurality of input signals, said gate being coupled to said first output of said clock generator circuit for receiving said first phase of said input clock signal;
  a first inverter having an input coupled to said source of said first transistor and having an output;
  a second transistor gate, a drain and a source, said drain being coupled to said output of said first inverter, said gate being coupled to said first output of said timing latch; and
  a second inverter having an input coupled to said source of said second transistor and having an output coupled to one of said plurality of first row conductors.

18. The programmable logic array of claim 17 wherein said second means includes:
  a third transistor having a gate, a drain and a source, said source being coupled to a first source of operating potential, said drain being coupled to one of said plurality of column conductors;
  a fourth transistor having a gate, a drain and a source, said source being coupled to said first source of operating potential, said drain being coupled to said one of said plurality of column conductors;
  a third inverter having an input coupled to said one of said plurality of column conductors and having an output coupled to said gate of said fourth transistor; and
  a first NAND gate having first and second inputs and an output, said first input being coupled to said second output of said timing latch, said second input being coupled to said output of said third inverter, said output being coupled to said gate of said third transistor.

19. The programmable logic array of claim 18 further including:
  a fourth inverter having an input coupled to said first output of said timing latch and having an output;
  a fifth transistor having a gate, a drain and a source, said source being coupled to a second source of operating potential, said drain being coupled to one of said plurality of second row conductors, said gate being coupled to said output of said fourth inverter; and
  a sixth transistor having a gate, a drain and a source, said source being coupled to said second source of operating potential, said drain being coupled to said one of said plurality of column conductors, said gate being coupled to said output of said fourth inverter.

20. The programmable logic array of claim 19 wherein said third means includes:
  a seventh transistor having a gate, a drain and a source, said source being coupled to said first source of operating potential, said drain being coupled to said one of said plurality of second row conductors;

an eighth transistor having a gate, a drain and a source, said source being coupled to said first source of operating potential, said drain being coupled to said one of said plurality of second row conductors;

a fifth inverter having an input coupled to said one of said plurality of second row conductors and having an output coupled to said gate of said eighth transistor; and a second NAND gate having first and second inputs and an output, said first input being coupled to said one of said plurality of column conductors, said second input being coupled to said output of said fifth inverter, said output being coupled to said gate of said seventh transistor.

* * * * *